(12) United States Patent
Kim et al.

(10) Patent No.: US 9,165,815 B2
(45) Date of Patent: Oct. 20, 2015

(54) WAFER PROCESSING SHEET

(75) Inventors: Se Ra Kim, Daejeon (KR); Hyo Sook Joo, Daejeon (KR); Suk Ky Chang, Daejeon (KR); Jung Sup Shim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/326,103

(22) Filed: Dec. 14, 2011

(65) Prior Publication Data

US 2012/0202337 A1 Aug. 9, 2012

Related U.S. Application Data

(63) Continuation of application No. PCT/KR2010/003836, filed on Jun. 15, 2010.

(30) Foreign Application Priority Data

Jun. 15, 2009 (KR) .................. 10-2009-0052948

(51) Int. Cl.
*H01L 21/762* (2006.01)
*B32B 27/40* (2006.01)
*H01L 21/683* (2006.01)

(52) U.S. Cl.
CPC ..... *H01L 21/6836* (2013.01); *H01L 2221/6834* (2013.01); *H01L 2221/68327* (2013.01); *Y10T 428/265* (2015.01); *Y10T 428/31511* (2015.04); *Y10T 428/31551* (2015.04); *Y10T 428/31935* (2015.04)

(58) Field of Classification Search
CPC ............. H01L 21/6836; H01L 2221/68327; H01L 2221/6834; Y10T 428/265; Y10T 428/31551; Y10T 428/31935

USPC ............ 428/458, 459, 413, 423.1, 522, 336
See application file for complete search history.

(56) References Cited

U.S. PATENT DOCUMENTS

| | | | | |
|---|---|---|---|---|
| 4,301,239 A | * | 11/1981 | Miller | ........................... 430/510 |
| 6,139,953 A | | 10/2000 | Nagamoto et al. | |
| 6,159,595 A | | 12/2000 | Sumi | |
| 6,436,795 B2 | * | 8/2002 | Noguchi et al. | ............. 438/460 |
| 7,534,498 B2 | * | 5/2009 | Noda et al. | ................... 428/446 |
| 7,829,441 B2 | * | 11/2010 | Takamoto | .................... 438/464 |

(Continued)

FOREIGN PATENT DOCUMENTS

| | | |
|---|---|---|
| CN | 1472597 A | 2/2004 |
| CN | 101077963 A | 11/2007 |

(Continued)

OTHER PUBLICATIONS

"Anti-Block Additives"; Encyclopedia of Polymers and Composites, 2014, pp. 1-11, Sep. 19, 2014.

*Primary Examiner* — Thao T Tran
(74) *Attorney, Agent, or Firm* — Dentons US LLP

(57) ABSTRACT

Provided is a sheet for processing a wafer. The sheet can exhibit excellent heat resistance and dimensional stability, prevent breakage of a wafer in response to residual stress due to excellent stress relaxation properties, inhibit damage to or dispersion of the wafer due to application of a non-uniform pressure, and also exhibit excellent cuttability. The sheet can effectively prevent a blocking phenomenon from occurring during wafer processing. For these reasons, the sheet can be useful for processing a wafer in various wafer preparation processes such as dicing, back-grinding and picking-up.

15 Claims, 1 Drawing Sheet

(56) References Cited

U.S. PATENT DOCUMENTS

| | | |
|---|---|---|
| 2004/0241910 A1 | 12/2004 | Matsumura et al. |
| 2006/0204749 A1 | 9/2006 | Kita et al. |
| 2008/0085397 A1 | 4/2008 | Asai et al. |
| 2008/0131634 A1* | 6/2008 | Kiuchi et al. ............... 428/34.9 |
| 2009/0017248 A1* | 1/2009 | Larson et al. ............... 428/41.5 |
| 2009/0017323 A1* | 1/2009 | Webb et al. ............... 428/521 |
| 2011/0139347 A1* | 6/2011 | Kim et al. ............... 156/154 |

FOREIGN PATENT DOCUMENTS

| | | |
|---|---|---|
| CN | 101186127 A | 5/2008 |
| EP | 1921120 A1 | 5/2008 |
| EP | 2267090 A2 | 12/2010 |
| EP | 2444995 A2 | 4/2012 |
| JP | 05-148457 A | 6/1993 |
| JP | 11-049811 A | 2/1999 |
| JP | 2000-178516 A | 6/2000 |
| JP | 2002141306 A | 5/2002 |
| JP | 2004-256595 | 9/2004 |
| JP | 2005-303068 A | 10/2005 |
| JP | 2006-049507 A | 2/2006 |
| JP | 2006-148096 A | 6/2006 |
| JP | 2006-342330 | 12/2006 |
| JP | 2008-031213 | 2/2008 |
| KR | 10-2006-0047526 | 5/2006 |
| KR | 10-0647132 B1 | 11/2006 |
| KR | 10-2008-0095283 A | 10/2008 |
| KR | 10-2009-0028803 A | 3/2009 |
| WO | 03043076 A2 | 5/2003 |
| WO | 2004/109786 | 12/2004 |
| WO | 2009066435 A1 | 5/2009 |

* cited by examiner

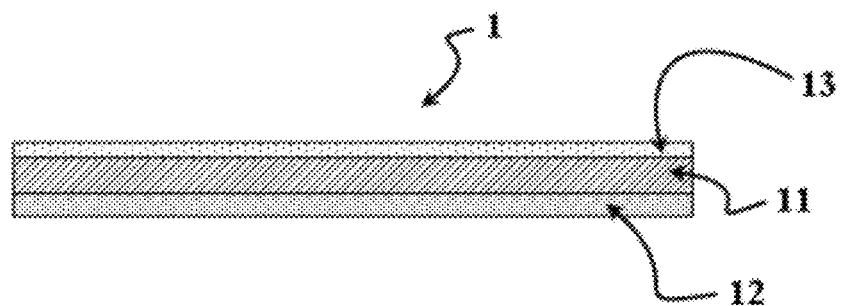

WAFER PROCESSING SHEET

CROSS-REFERENCE TO RELATED APPLICATION

This application is a continuation of International Application PCT/KR2010/003836, with an international filing date of Jun. 15, 2010, which claims priority to and the benefit of Korean Patent Application No. 10-2009-0052948, filed Jun. 15, 2009, the disclosure of which is incorporated herein by reference in its entirety.

BACKGROUND

A preparation method for a semiconductor device that includes a back-grinding process or dicing process, during which a sheet such as a surface protective sheet or dicing sheet is used.

Recently, since the demand for compact and light-weight semiconductor devices has increased, the performance of such a sheet for processing a wafer has accordingly become more and more important.

For example, in order to make a circuit having a higher degree of integration than a conventional method in which a circuit is formed only on one side of a wafer, circuits should be formed on both sides of a wafer. In order to form circuits on both sides of the wafer, the wafer to which a processing sheet is attached should be subjected to a high-temperature process. Thus, the sheet for processing a wafer requires excellent heat-resistance or dimensional stability at high temperature. However, when a hard substrate having a high melting point is used in order to secure heat resistance and dimensional stability, protection of the wafer is degraded and stress relaxation is also reduced, leading to a higher probability of damage to the wafer.

The sheet for processing a wafer should have excellent stress relaxation properties and have no protrusions such as fish eyes. When the stress relaxation properties are reduced or a protrusion is present on the sheet, the wafer is easily damaged due to residual stress or due to non-uniform pressure. Such a phenomenon is more common due to the demand for a wafer having a large diameter and small thickness.

Regarding the sheet for processing a wafer, an excellent cuttability is required. When cuttability is decreased, a cutting defect may occur during the process, and thus wafer processing may be discontinuously performed. Consequently, when the cuttability of the sheet for processing a wafer is decreased, production efficiency can be reduced and the wafer can be damaged.

Korean Patent Application Publication No. 2006-0047526 discloses an adhesive sheet having a specific range of storage modulus for the prevention of damage to a wafer, even when applied to a thin film of the wafer.

However, there are no currently-known techniques, including the Korean Patent Application Publication No. 2006-0047526, for a sheet for processing a wafer that satisfies all of the properties as described above.

SUMMARY OF THE INVENTION

The present invention provides a sheet for processing a wafer and a method for processing the wafer.

One aspect of the present invention provides a sheet for processing a wafer including a substrate and an anti-blocking layer. The anti-blocking layer is formed on the substrate and has a thermally cured resin component or an uncured resin component.

Hereinafter, the sheet for processing a wafer will be described in detail.

The kind of a substrate useable herein is not particularly limited. In the present invention, any kind of substrate can be used as long as it has excellent cuttability, heat resistance, dimensional stability and stress relaxation properties, and also has a uniform plane without protrusions such as fish eyes.

The substrate may have a glass transition temperature ($T_g$), ranging from −20° C. to 45° C., preferably −10° C. to 40° C., more preferably −5° C. to 40° C., and most preferably 0° C. to 35° C. The glass transition temperature may be measured using a differential scanning calorimeter (DSC). In the present invention, if two or more glass transition temperatures are detected as a result of the DSC analysis, then the average value of the glass transition temperatures that is calculated by considering each component of the composition is the glass transition temperature as a representative value. By controlling the glass transition temperature within the above range, a substrate having excellent protective function with respect to the wafer and stress relaxation properties may be provided.

The substrate may have a toughness ranging from 10 kg·mm to 250 kg·mm, preferably 10 kg·mm to 200 kg·mm, at a temperature of 23° C., preferably 20° C. to 25° C., and more preferably 15° C. to 30° C. The toughness may be measured by a tension test. In detail, the substrate is cut as a sample having a size of 15 mm×15 mm The size of the sample indicates that of a region which excludes the region taped to fix the sample to a tension tester during the tension test. After preparation of the sample, the sample is fixed to the tester and then elongated in the vertical direction at a rate of 180 mm/min to 220 mm/min, though preferably 200 mm/min at the measurement temperature. A graph of the force measured according to distance until the sample is cut is plotted. The force-versus-distance curve is integrated to estimate toughness.

By controlling the toughness within the above range, the substrate having excellent stress relaxation properties and cuttability can be provided.

The structure of the substrate is not particularly limited as long as it is configured to have the properties described above. For example, the substrate may have a single layer structure or multi-layer structure in which at least two layers are stacked. In the case of the multi-layer structure, any or all of the layers may satisfy the above-described properties, though preferably all of the layers have the above-described properties.

The substrate usable herein may be a substrate formed from a polyolefin such as polyethylene, polypropylene, ethylene-vinyl acetate copolymer, ethylene-alkyl(meth)acrylate copolymer in which the alkyl chain consists of 1 to 4 carbon atoms, ethylene-α-olefin copolymer or propylene-α-olefin copolymer; a polyester such as polyethyleneterephthalate or polybutyltherephthalate; a polyvinylchloride; a polyester elastomer; or a urethane, but is not limited thereto. The substrate may be, but is not particularly limited to, formed through (T-die) extrusion, inflation, casting or calendering.

The substrate may be a photo-cured product of a photo-curable composition including a high-molecular weight polymer and monomer component. The substrate may be preferably formed by casting the photo-curable composition. The substrate may have better properties such as stress relaxation properties, dimensional stability, heat resistance and cuttability, and a more uniform plane with no fish eyes compared to the conventional substrate.

The term "photo-curable composition" used herein refers to a composition including a component that can be cross-linked, polymerized or cured by electromagnetic wave irradiation. The term "electromagnetic wave" used herein refers to a generic term including microwaves, IR waves, UV waves, X rays, γ rays, and particle beams such as α-particle beams, proton beams, neutron beams, and electron beams.

In the present invention, the kind of the photo-curable composition forming such a photo-cured product is not particularly limited, and the composition may be prepared using various high-molecular weight polymers.

The term "high-molecular weight polymer" used herein refers to a generic term for polymers formed by polymerizing at least two monomers and includes a so-called oligomer. The high-molecular weight polymer may have an average molecular weight ($M_w$) of about 500 to 1,000,000, preferably about 1,000 to 900,000, and more preferably about 3,000 to 800,000. The average molecular weight ($M_w$) refers to a converted value with respect to standard polystyrene, as measured by gel permeation chromatography (GPC).

In one embodiment, the high-molecular weight polymer may be a polymer of a monomer mixture including a (meth) acrylate ester monomer (hereinafter, referred to as an "acrylic polymer"). Hereinafter, the photo-curable composition including the above polymer of the (meth)acrylate ester monomer may be referred to as a "first type of photo-curable composition". When the high-molecular weight polymer is the above type, the photo-curable composition may include a partially polymerized product of the monomer mixture including the (meth)acrylate ester monomer. In the partially polymerized product, some monomers may constitute the high-molecular weight polymer, i.e., the acrylic polymer, by being polymerized, while the other unreacted monomers may be included in the photo-curable composition as the monomer component. However, in the present invention, a method for preparing the photo-curable composition is not limited to the above-described method. For example, the photo-curable composition may be prepared by mixing the high-molecular weight polymer and monomer component, not by partial polymerization method.

The kind of the (meth)acrylate ester monomer included in the monomer mixture may include, but is not limited to, at least one from the group consisting of: alkyl (meth)acrylate; (meth)acrylate having an alkoxy group; (meth)acrylate having an alicyclic group; (meth)acrylate having an aromatic group; and (meth)acrylate having a heterocyclic moiety.

Examples of the alkyl (meth)acrylate may include alkyl (meth)acrylates in which the alkyl group has 1 to 14 carbon atoms, such as methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate, and tetradecyl (meth)acrylate. Examples of the (meth) acrylate having an alkoxy group may include 2-(2-ethoxyethoxy)ethyl (meth)acrylate, ethyleneglycol phenyl ether (meth)acrylate, polyethyleneglycol (polymerization degree: 2 to 8) phenyl ether (meth)acrylate, ethyleneglycol nonyl phenyl ether (meth)acrylate or polyethyleneglycol (polymerization degree: 2 to 8) nonyl phenyl ether (meth)acrylate. Examples of the (meth)acrylate having alicyclic group may include dicyclophentenyl (meth)acrylate, and dicyclopentenyloxy (meth)acrylate; examples of the (meth)acrylate having an aromatic group may include phenylhydroxypropyl (meth)acrylate and benzyl (meth)acrylate; and examples of the (meth)acrylate heterocyclic moiety may include tetrahydrofurfuryl (meth)acrylate, morpholinyl (meth)acrylate, and isobonyl (meth)acrylate. However, the kinds of (meth)acrylic acid ester monomer usable herein are not limited to the above examples.

In the present invention, the monomer mixture forming the partially polymerized product may further include a monomer having a polar functional group, for example, a hydroxyl group, a carboxyl group, a nitrogen-containing group or a glycidyl group. The monomer having a hydroxyl group may be 2-hydroxyethyl (meth)acrylate, 2-hydroxypropyl (meth) acrylate, 4-hydroxybutyl (meth)acrylate, 6-hydroxyhexyl (meth)acrylate, 8-hydroxyoctyl (meth)acrylate, 2-hydroxyethyleneglycol (meth)acrylate or 2-hydroxypropyleneglycol (meth)acrylate; the monomer having a carboxyl group may be (meth)acrylic acid, 2-(meth)acryloyloxy acetic acid, 3-(meth)acryloyloxy propionic acid, 4-(meth)acryloyloxy butyric acid, acrylic acid dimer, itaconic acid, maleic acid or maleic acid anhydride; the monomer having a nitrogen-containing group may be (meth)acrylamide, N-vinyl pyrrolidone or N-vinyl caprolactam; and the monomer having a glycidyl group may be glycidyl (meth)acrylate. However, the present invention is not limited thereto.

The monomer mixture may further include monomers other than the above-described monomer, as necessary. The weight ratio of each component included in the monomer mixture is not particularly limited and may be adjusted by considering the curing efficiency or the desired properties of the photo-curable material, such as the glass transition temperature and toughness.

The method of partially polymerizing the monomer mixture is not particularly limited and may be performed by known methods such as bulk polymerization.

When the monomer mixture is partially polymerized, the conversion rate of the monomer is not particularly limited, and it may be controlled by considering the curing efficiency, desired properties, and the like.

The first type of photo-curable composition may further include multifunctional acrylate. The multifunctional acrylate may be separately mixed after the partial polymerization, or previously included in the monomer mixture forming the partially polymerized product in some cases. As necessary, the photo-curable composition may be prepared by separately mixing the high-molecular weight polymer, the monomer component, and the multifunctional acrylate.

The kind of the multifunctional acrylate is not particularly limited. Examples of the multifunctional acrylate may include, but are not limited to, bifunctional acrylates such as 1,4-butanediol di(meth)acrylate, 1,6-hexanediol di(meth) acrylate, neopentylglycol di(meth)acrylate, polyethyleneglycol di(meth)acrylate, neopentylglycol adipate di(meth)acrylate, hydroxypivalic acid neopentylglycol di(meth)acrylate, dicyclopentanyl di(meth)acrylate, caprolactone-modified dicyclopentenyl di(meth)acrylate, ethyleneoxide-modified di(meth)acrylate, di(meth)acryloxy ethyl isocyanurate, allylated cyclohexyl di(meth)acrylate, tricyclodecane dimethanol(meth)acrylate, dimethylol dicyclopentane di(meth)acrylate, ethyleneoxide-modified hexahydrophthalic acid di(meth)acrylate, tricyclodecane dimethanol(meth)acrylate, neopentylglycol-modified trimethylpropane di(meth)acrylate, adamantane di(meth)acrylate, and 9,9-bis[4-(2-acryloyloxyethoxy)phenyl]fluorine; trifunctional acrylates such as trimethylolpropane tri(meth)acrylate, dipentaerythritol tri (meth)acrylate, propionic acid-modified dipentaerythritol tri (meth)acrylate, pentaerythritol tri(meth)acrylate, propyleneoxide-modified trimethylolpropane tri(meth)acrylate, trifunctional urethane (meth)acrylate, and tris(meth)acryloxyethylisocyanurate; tetrafunctional acrylates such as diglycerin tetra(meth)acrylate, and pentaerythritol tetra(meth)

acrylate; pentafunctional acrylates such as propionic acid-modified dipentaerythritol penta(meth)acrylate; and hexafunctional acrylates such as dipentaerythritol hexa(meth)acrylate, caprolactone-modified dipentaerythritol hexa (meth)acrylate, and urethane (meth)acrylate (e.g. a reaction product of isocyanate monomer and trimethylolpropane tri(meth)acrylate).

In the first type of photo-curable composition, the multifunctional acrylate may be included in an amount of 0.01 to 10 parts by weight, relative to 100 parts by weight of the total weight of the high-molecular weight polymer and monomer component. However, the content may be altered according to the process efficiency or properties such as the glass transition temperature, toughness, and the like.

Unless otherwise defined in the present invention, the unit "part by weight" refers to the weight ratio.

The first type of photo-curable composition may further include a photoinitiator, which may induce polymerization of a polymer, a monomer or multifunctional acrylate due to light application.

The kind of the photoinitiator usable herein may be, but is not particularly limited to, one of the photoinitiators known in the art, for example a benzoin compound, hydroxyketone compound, aminoketone compound, peroxide compound or phosphineoxide compound.

The photo-curable composition may include the photoinitiator in an amount of 0.01 to 10 parts by weight, though preferably 0.1 to 5 parts by weight, relative to 100 parts by weight of the total weight of the high-molecular weight polymer and monomer component. By controlling the amount of photoinitiator within the above range, effective curing may be induced and degradation of the properties due to components remaining after curing may be prevented.

In another embodiment, the high-molecular weight polymer may be urethane acrylate, ester acrylate, ester urethane acrylate, ether acrylate, ether urethane acrylate, epoxy acrylate, and the like. Hereinafter, such an acrylate may be referred to as an "oligomer component", and the photo-curable composition including the component may be referred to as a "second type of photo-curable composition".

The urethane acrylate may be, but is not limited to, a reaction product of a polyisocyanate compound and hydroxyl-containing (meth)acrylate. In this case, the kind of polyisocyanate compound is not particularly limited. In the present invention, examples of the compound may include polyisocyanates having at least two isocyanate groups, such as aliphatic, cycloaliphatic or aromatic polyisocyanate. In detail, examples of the polyisocyanate may include 2,4-tolylene diisocyanate, 2,6-tolylene diisocyanate, 1,3-xylene diisocyanate, 1,4-xylene diisocyanate, and diphenylmethane-4,4'-diisocyanate isophorone diisocyanate. In the present invention, the examples of the hydroxyl-containing (meth)acrylate forming the urethane acrylate may also include, but are not limited to, hydroxyalkyl (meth)acrylates such as 2-hydroxyethyl (meth)acrylate, 2-hydroxypropyl (meth)acrylate, 4-hydroxybutyl (meth)acrylate, 6-hydroxyhexyl (meth)acrylate, and 8-hydroxyoctyl (meth)acrylate.

As the urethane acrylate, a reaction product of the hydroxyl-containing (meth)acrylate and urethane prepolymer having isocyanate in its terminal, which is a reaction product of ester polyol and an isocyanate compound, may be used. Ester polyol, which can be used in this case may be a conventional component known in the art, such as an esterification reaction product of polyol and/or ester polyol with an acid component such as dibasic acid or an anhydride thereof. The polyol may be ethylene glycol, propylene glycol, cyclohexane dimethanol or 3-methyl-1,5-pentanediol; the ester polyol may be a polyalkylene glycol such as polyethylene glycol, polypropylene glycol or polytetramethylene glycol, or a diol of a block or random polymer such as polyethylene polypropoxy block polymer diol; and the acid component may be a dibasic acid such as adipic acid, succinic acid, phthalic acid, tetrahydrophthalic acid, hexahydrophthalic acid or terephthalic acid, or an anhydride thereof. In addition, the examples of the isocyanate compound and hydroxy-containing (meth)acrylate usable herein are the same as described above.

The urethane acrylate may be a reaction product of the hydroxy-containing (meth)acrylate and urethane prepolymer having isocyanate in its terminal, which is a reaction product of the ether polyol and the isocyanate compound.

The ester acrylate usable herein may be a dehydrate condensation reaction product of the ester polyol and (meth)acrylic acid. In this case, usable ester polyol may be compounds as described above.

The ether acrylate may be a polyalkylene glycol di(meth)acrylate such as polyethyleneglycol di(meth)acrylate, polypropyleneglycol di(meth)acrylate or polytetramethyleneglycol di(meth)acrylate.

The epoxy acrylate usable herein may be an additional reaction product of an epoxy resin and (meth)acrylic acid. In this case, the kind of the epoxy resin may be, but is not limited to, a conventional aromatic or aliphatic epoxy resin known in the art.

When the oligomer component is prepared by reacting the compounds, the reaction conditions or the ratio of the reactants is not particularly limited. That is, considering the properties required in the photo-cured product, the reaction conditions may be appropriately selected. In the present invention, in the process of manufacturing the oligomer component, other components may be appropriately reacted with the above-described compound.

In the present invention, among the oligomers described above, urethane acrylate may be preferably used, but it is not limited thereto.

The second type of photo-curable composition may further include a reactive monomer.

The kind of reactive monomer included with the oligomer component is not particularly limited, but may be, for example, as in the first type of photo-curable composition, a (meth)acrylic acid ester monomer, a monomer having a polar functional group, multifunctional acrylate, a monomer having an alkoxy group, a monomer having an aromatic group or a monomer having a heterocyclic moiety.

The reactive monomer may be included in an amount of 10 to 400 parts by weight, relative to 100 parts by weight of the oligomer component. By controlling the weight ratio of the reactive monomer in such a manner, the efficiency of forming a layer of the photo-curable composition can be highly maintained, and the properties of the photo-cured product can be effectively adjusted.

The second type of photo-curable composition may further include a photoinitiator as necessary. In this case, the kind of photoinitiator used herein is as described above. The photoinitiator may be included in an amount of 0.01 to 10 parts by weight, and preferably 0.1 to 5 parts by weight, relative to 100 parts by weight of the total weight of the high-molecular weight polymer and monomer component. By controlling the amount of the photoinitiator within the above range, effective curing may be induced and degradation of the properties due to components remaining after curing may be prevented.

The first or second type of photo-curable composition may further include at least one additive selected from the group consisting of a dye, a pigment, an epoxy resin, a cross-linking agent, a UV stabilizer, an antioxidant, a coloring agent, a reinforcing agent, a filler, a foaming agent, a surfactant, a light thickening agent, and a plasticizer.

Methods for preparing the substrate are not particularly limited, however it is preferable to prepare the substrate by subjecting the photo-curable composition to a casting process. That is, the substrate may be prepared by casting the photo-curable composition and then curing the casted composition.

By preparing the substrate through the above process, it is possible to prepare a substrate having a uniform plane without protrusions such as a fish eye thereon. Accordingly, the present invention can prevent a flying-off phenomenon as well as cracking in the wafer, which could be induced when a non-uniform pressure is applied. Further, the present invention can provide a substrate having maximized cuttability and stress relaxation properties.

The method for casting the photo-curable composition is not particularly limited, and it may be carried out through bar coating, knife coating, roll coating, spray coating, gravure coating, curtain coating, comma coating or lip coating, according to the desired thickness.

After the casting process, electromagnetic waves such as UV rays are irradiated onto the photo-curable composition in order to induce curing. In this case, the method for irradiating the composition with electromagnetic waves is not particularly limited, and a conventional method known in the art may be employed. For example, in the case of employing UV irradiation, it may be performed using a metal halide lamp, a high-pressure mercury lamp, a black light lamp, an electrodeless lamp or a xenon lamp. The UV irradiation conditions are not particularly limited but may be selected according to the composition to be cured or the property of the photo-cured product.

The shape of the substrate as described above is not particularly limited. The substrate may be formed in the shape of a film or sheet. In the case in which the substrate is formed in the shape of a film or a sheet, it may have a thickness of about 5 μm to 400 μm or about 10 to 300 μm, but the thickness is not limited thereto.

In order to improve adhesion strength to the anti-blocking layer or the pressure-sensitive adhesive layer, the substrate may be subjected to surface treatment such as primer or corona treatment, and to improve production efficiency, an appropriate color may be applied to the substrate.

The sheet for processing a wafer according to the present invention includes an anti-blocking layer formed on the substrate. The anti-blocking layer may be formed on one or both sides of the substrate.

The anti-blocking layer includes a thermally-cured resin component or uncured resin component. By forming the anti-blocking layer using a thermally-cured or uncured resin component, it is possible to effectively prevent blocking and also effectively protect the wafer during wafer processing. That is, it is also possible to use a photo-curable resin such as a UV-curable resin when the aim is only to prevent blocking phenomenon. However, in the case in which the anti-blocking layer is formed of UV-curable resin, the anti-blocking layer has a highly increased cross-linking density and therefore has an excessively high modulus at the same glass transition temperature, compared to when the thermally-cured or uncured resin component is used. As a result, when the photo-curable resin is used, the sheet for processing a wafer can be severely bent or deformed, leading to damage. Such problems are more easily found in a thin and large-sized wafer. However, in the present invention, since the anti-blocking layer is formed of a thermally-cured or uncured resin component, it can overcome such disadvantages and excellently prevent blocking phenomenon.

The anti-blocking layer may have a glass transition temperature of 80° C. or more, preferably 100° C., more preferably 150° C., and most preferably 200° C. or higher. The glass transition temperature may be measured by DSC. By controlling the glass transition temperature in the above-described manner, excellent anti-blocking effects can be ensured. In the present invention, as the glass transition temperature is increased, the better the anti-blocking effect. In this case, the upper limit of the glass transition temperature is not particularly limited, but the glass transition temperature may be appropriately adjusted within a range of 400° C. or less.

In the present invention, the thermally-cured resin component may include an acrylic polymer that is cross-linked by a multifunctional cross-linking agent. The anti-blocking layer including such a resin component may be formed by coating the thermally-curable resin composition, including the acrylic polymer and multifunctional cross-linking agent on the substrate, and cross-linking the resin composition; or forming a cross-linked layer of the resin composition in advance and then laminating the cross-linked layer on the substrate. A method for cross-linking the thermally-curable resin composition is not particularly limited, but may include drying, heating and/or aging.

The kind of acrylic polymer usable herein is not particularly limited, as long as it can be cross-linked by the multifunctional cross-linking agent.

In the present invention, as the acrylic polymer, an acrylic polymer including, in polymerized form, 90 to 99.9 parts by weight of (meth)acrylic acid ester monomer and 0.1 to 10 parts by weight of a cross-linkable monomer may be used. The (meth)acrylic acid ester monomer may be alkyl (meth)acrylate, though preferably alkyl (meth)acrylate having an alkyl group of 1 to 14 carbon atoms, and the cross-linkable monomer may be, but is not limited to, a monomer having a carboxyl, hydroxyl, nitrogen-containing or glycidyl group.

The method for preparing the polymer using the above monomer is not particularly limited, but may be prepared by a general polymerization method such as solution polymerization, photo-polymerization, bulk polymerization, suspension polymerization or emulsion polymerization.

The kind of multifunctional cross-linking agent used to cross-link the acrylic polymer is not particularly limited, but may be a general cross-linking agent known in the art, which can thermally cross-link a cross-linkable acrylic polymer known in the art. Examples of the cross-linking agent may include, but are not limited to, an isocyanate compound, an epoxy compound, an aziridine compound, and a metal chelate.

The thermally-cured resin composition forming the anti-blocking layer may include 0.1 to 20 parts by weight of the multifunctional cross-linking agent, relative to 100 parts by weight of the acrylic polymer.

The properties of the acrylic polymer used herein such as average molecular weight, glass transition temperature, etc., or the cross-linking density of the anti-blocking layer, may be adjusted according to the desired applications and properties, for example, the glass transition temperature.

Further, when the anti-blocking layer includes an uncured resin component, the resin component may include an acrylic polymer, polyimide or cellulose resin. The properties of the resin component such as average molecular weight or glass transition temperature may be adjusted according to the desired applications and properties, for example, the glass transition temperature.

The method for forming the anti-blocking layer, including the uncured resin component, is not particularly limited. The anti-blocking layer may be formed by preparing a coating solution by diluting the resin with an appropriate amount of solvent, coating and then drying the coating solution on a substrate; or by coating and drying the coating solution on a separate substrate, such as a releasing film to form the anti-blocking layer in advance and then laminating the anti-blocking layer on the substrate.

The anti-blocking layer may have a thickness of 0.1 μm to 20 μm. When the thickness is less than 0.1 μm, the effect of the anti-blocking layer could be insignificant, and when the thickness is more than 20 μm, the properties to follow the surface of the wafer and stress relaxation properties could be degraded.

The sheet for processing a wafer may further include a pressure-sensitive adhesive layer. In the present invention, the location at which the pressure-sensitive adhesive layer is formed is not particularly limited. FIG. 1 is a cross-sectional view of a sheet for processing a wafer according to an exemplary embodiment of the present invention. As shown in FIG. 1, a sheet 1 of the present invention includes a anti-blocking layer 12 formed on one side of a substrate 11 described above, and a pressure-sensitive adhesive layer 13 formed on the opposite side of the substrate that is free of the anti-blocking layer 12. However, the structure of the sheet is not limited to that shown in FIG. 1. The sheet of the present invention may be formed in one of various structures, which can be implemented in the art, including a structure in which the anti-blocking layers may be formed on both sides of the substrate, and the pressure-sensitive adhesive layer may be formed on at least one anti-blocking layer.

The kind of pressure-sensitive adhesive layer included in the sheet is not particularly limited. In this art, various pressure-sensitive adhesives usable in the wafer processing sheet such as a surface protective sheet, a dicing sheet or a pick-up sheet are disclosed, and an appropriate one among these can be selected and used without limitation. In the present invention, as the pressure-sensitive adhesive, a silicon pressure-sensitive adhesive, synthetic rubber pressure-sensitive adhesive, natural rubber pressure-sensitive adhesive, or acrylic pressure-sensitive adhesive may be used. Preferably, acrylic pressure-sensitive adhesive may be used, though more preferably a pressure-sensitive adhesive including an acrylic polymer cross-linked by a multifunctional cross-linking agent may be used, but the kind of the pressure-sensitive adhesive usable herein is not limited thereto.

The thickness of the pressure-sensitive adhesive layer is not particularly limited, and, for example, it can be controlled within a range of about 0.5 μm to 60 μm, though preferably about 1 μm to 40 μm.

The sheet for processing a wafer may further include an appropriate releasing sheet formed on the pressure-sensitive adhesive layer in order to prevent impurities from being introduced.

The present invention is also directed to a method of processing a wafer, including attaching the sheet of the present invention to a wafer and processing the wafer to which the sheet is attached.

The method for processing a wafer is characterized by using the sheet for processing a wafer according to the present invention. For example, the wafer may be processed after the sheet of the present invention is laminated on the wafer through pressing or hot-roll lamination.

The wafer processing step may be a dicing step, back-grinding step or picking-up step, and the conditions thereof are not particularly limited.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIG. 1 is a cross-sectional view of a sheet for processing a wafer according to an exemplary embodiment of the present invention.

DETAILED DESCRIPTION OF EXEMPLARY EMBODIMENTS

Hereinafter, the present invention will be described with reference to examples and comparative examples in detail. However, the present invention is not limited to these examples.

EXAMPLE 1

Formation of Anti-Blocking Layer

A monomer mixture of 90 parts by weight of methyl methacrylate (MMA) and 10 parts by weight of hydroxyethyl methacrylate (HEMA) was polymerized to prepare an acrylic polymer having a solid content of 20 wt %. Subsequently, relative to 100 parts by weight of the acrylic polymer as prepared above, 10 parts by weight of an isocyanate curing agent (TDI) was mixed therewith to prepare a coating solution. Then, the coating solution as prepared above was coated on a polyester releasing film using a bar coater to have a thickness of 2 μm after being dried; drying and aging of the coated layer was performed under the appropriate conditions so as to form an anti-blocking layer.

Formation of Substrate

A monomer mixture including 70 parts by weight of 2-ethylhexyl acrylate (2-EHA), 27 parts by weight of isobornyl acrylate (IBOA) and 3 parts by weight of hydroxyethyl acrylate (2-HEA) was input into a 1 L reactor containing refluxed nitrogen gas and a cooling apparatus for easy adjustment of the temperature. The nitrogen gas was then purged in order to remove oxygen. Afterwards, the mixture was homogenized while maintaining the temperature at 60° C., mixed with 0.015 parts by weight of diethylhexyl peroxydicarbonate as an initiator and 0.04 parts by weight of n-dodecyl mercaptan (n-DDM) as a chain transfer agent and then reacted to prepare a partially-polymerized acrylic syrup. Then, a photo-curable composition was prepared by mixing 70 parts by weight of the partially-polymerized acrylic syrup, 30 parts by weight of isobornyl acrylate (IBOA) as an additional monomer component for dilution, and 0.5 parts by weight of Igacure 184 (1-hydroxy cyclohexyl phenyl ketone) as a photoinitiator, followed by defoaming of the mixture. Subsequently, the prepared composition was coated on the anti-blocking layer as described above using a bar coater to a thickness of about 160 μm after being cured. Then, to prevent the coated layer from coming in contact with oxygen, a polyester releasing film was laminated thereon, and UV-A light was irradiated using a metal halide lamp at a light intensity of 800 mJ/cm$^2$, thereby forming the substrate.

Formation of Adhesive Film for Processing Wafer

The reaction product obtained by reacting an acrylic polymer prepared by polymerizing 95 parts by weight of 2-ethylhexyl acrylate (2-EHA) and 5 parts by weight of 2-hydroxy ethyl acrylate (2-HEA) with methacryloyloxyethyl isocyanate (MOI) was coated on a releasing film to form an pressure-sensitive adhesive layer having a thickness of about 20 μm, after which the prepared pressure-sensitive adhesive layer was laminated onto the opposite side of the anti-blocking layer of the substrate, thereby forming a sheet for processing a wafer.

EXAMPLE 2

A sheet for processing a wafer was formed according to the same method as described in Example 1, except that, when the anti-blocking layer was formed, the isocyanate curing agent (TDI) was not used, such that an anti-blocking layer including uncured acrylic polymer was formed.

EXAMPLE 3

A sheet for processing a wafer was formed according to the same method as described in Example 1, except that, when an anti-blocking layer was formed, cellulose acetate resin was used instead of the mixture including acrylic polymer and the isocyanate curing agent, such that an anti-blocking layer including uncured cellulose acetate resin was formed.

EXAMPLE 4

A sheet for processing a wafer was formed according to the same method as described in Example 1, except that, when an anti-blocking layer was formed, polyimide was used instead of the mixture including acrylic polymer and the isocyanate curing agent, such that an anti-blocking layer including uncured resin was formed.

COMPARATIVE EXAMPLE 1

A sheet for processing a wafer was formed according to the same method as described in Example 1, except that the anti-blocking layer was not formed.

COMPARATIVE EXAMPLE 2

A sheet for processing a wafer was formed according to the same method as described in Example 1, except that an anti-blocking layer was formed by subjecting a photo-curable composition including dipentaerythritol hexaacrylate (DPPA) and Igacure 184 (1-hydroxy cyclohexyl phenylketone) as a photoinitiator to a UV-curing method.

Properties of the anti-blocking layers, the substrates, and the sheets for processing a wafer of Examples and Comparative Examples were evaluated by the method described below, and the results are summarized in Table 1.

<Measurement of Glass Transition Temperature (Tg)>

The glass transition temperature of the anti-blocking layer was determined by using a differential scanning calorimeter (TA Instruments, Inc.). When the glass transition temperature was measured, the heating rate was set to 10° C/min.

<Evaluation of Anti-Blocking Performance>

An 8-inch silicon (Si) wafer was attached to the sheet for processing a wafer as prepared above using a wafer mounter. In an oven at 80° C., the sheet attached to the wafer was placed on a stainless plate with the anti-blocking layer in contact with the stainless plate, and a force of 200 g was applied thereto and maintained for 5 minutes. In the case of Comparative Example 1, the sheet was placed on a stainless plate with the substrate in contact with the plate. Afterwards, while the wafer to which the sheet for processing a wafer was attached was peeled from the stainless plate, and anti-blocking performance was measured according to the following criteria:

○: The case in which the wafer to which the sheet for processing a wafer was attached was easily peeled from the stainless plate without blocking.

×: The case in which the blocking phenomenon occurred during the wafer to which the sheet for processing a wafer was attached was peeled from the stainless plate.

<Evaluation of Cuttability>

An 8-inch silicon (Si) wafer was attached to the sheets for processing a wafer of Examples and Comparative Examples using a wafer mounter, and the film was cut along the shape of the wafer using an expender (HS-1810, Hugle electronics, Inc.). Subsequently, the height of the stage was set to 3 to observe the cutting plane of the film. In detail, the starting and intermediate portions of the cutting plane were observed using an optical microscope, and cuttability was measured by evaluating burr generation and torn degree in the cutting plane according to the following criteria:

○: The case in which an area rate of a torn part with respect to the total area of the film is 3% or less when the starting portion of the cutting of the film was observed at a magnification of 50× and at a resolution of 640×480.

Δ: The case in which an area rate of a torn part with respect to the total area of the film is 4% to 7% when the starting portion of the cutting of the film was observed at a magnification of 50× and at a resolution of 640×480.

×: The case in which an area rate of a torn part with respect to the total area of the film is 8% or more when the starting portion of the cutting of the film was observed at a magnification of 50× and at a resolution of 640×480.

<Evaluation of Adhesion Strength>

An 8-inch silicon (Si) wafer was attached to the sheet for processing a wafer using a wafer mounter (DS Precision, Inc. DYWMDS-8'), and lamination bubbles were counted on the surface of the attached wafer in order to evaluate the adhesion strength according to the following criteria.

<Criteria for Evaluating Adhesion>

○: 3 or less bubbles are generated.
Δ: 4 to 7 bubbles are generated.
×: 8 or more bubbles are generated.

<Evaluation of Grindability of Wafer>

An 8-inch silicon (Si) wafer was attached to the sheet for processing a wafer using a wafer mounter (DS Precision, Inc. DYWMDS-8'), and the film was cut along the shape of the wafer using an expender. Subsequently, the wafer was grinded using a wafer back-grinder (SVG-502MKII8), and the grindability of the wafer was evaluated on the basis of frequencies of warpage, damage and cracking of the wafer according to the following criteria:

○: The wafer had no warpage, damage or cracks.
Δ: The wafer had a warpage of about 1 to 5 mm, or damages and/or cracks were weakly generated.
×: The wafer had a warpage greater than 5 mm, or damages and cracks were largely generated.

The observation results are summarized in Table 1.

TABLE 1

|  | Example | | | | Comparative Example | |
| --- | --- | --- | --- | --- | --- | --- |
|  | 1 | 2 | 3 | 4 | 1 | 2 |
| Glass Transition Temperature of the anti-blocking Layer (° C.) | 107 | 103 | 191 | 250 | — | 95 |
| Anti-Blocking Performance | ○ | ○ | ○ | ○ | × | ○ |
| Cuttability | ○ | ○ | ○ | ○ | ○ | ○ |
| Adhesion strength | ○ | ○ | ○ | ○ | ○ | ○ |

TABLE 1-continued

|  | Example | | | | Comparative Example | |
| --- | --- | --- | --- | --- | --- | --- |
|  | 1 | 2 | 3 | 4 | 1 | 2 |
| Wafer Grindability | ○ | ○ | ○ | ○ | ○ | x |

As shown in Table 1, Examples according to the present invention exhibited excellent anti-blocking performance, cuttability, adhesion strength and wafer grindability.

On the other hand, in Comparative Example 1, in which the anti-blocking layer was not formed, a blocking phenomenon such as fusing of the sheet to the stainless plate occurred. Thus, it can be confirmed that Comparative Example 1 is difficult to be applied to actual wafer processing.

In addition, in Comparative Example 2, in which an anti-blocking layer was formed by using a UV-curable resin component, a modulus of the anti-blocking layer was excessively high. Thus, it can be confirmed that the wafer grindability is significantly reduced.

Consequently, the present invention can provide a sheet for processing a wafer. The sheet for processing a wafer can exhibit excellent heat resistance and dimensional stability, prevent breakage of a wafer in response to residual stress due to excellent stress relaxation properties, inhibit damage to or dispersion of the wafer due to application of a non-uniform pressure, and also exhibit excellent cuttability. The sheet can effectively prevent a blocking phenomenon from occurring during wafer processing. For these reasons, the sheet can be useful for processing a wafer in various wafer processing processes such as dicing, back-grinding and picking-up.

While the invention has been shown and described with reference to certain exemplary embodiments thereof, it will be understood by those skilled in the art that various changes in form and details may be made therein without departing from the spirit and scope of the invention as defined by the appended claims.

That which is claimed:

1. A sheet for processing a wafer, comprising:
    a substrate, of which a toughness is from 10 kg·mm to 250 kg·mm at 23° C.;
    an anti-blocking layer that is formed on one side of the substrate and that comprises a thermally-cured resin component or an uncured resin component; and
    a pressure-sensitive adhesive layer that is formed on the opposite side of the substrate, and
    wherein the anti-blocking layer has a glass transition temperature of 107° C. to 250° C., and wherein the substrate has a glass transition temperature of −20° C. to 45° C.

2. The sheet according to claim 1, wherein the substrate is a photo-cured product of a photo-curable composition comprising high-molecular weight polymer and monomer component.

3. The sheet according to claim 2, wherein the photo-curable composition comprises a partially polymerized product of a monomer mixture comprising a (meth)acrylic acid ester monomer.

4. The sheet according to claim 2, wherein the high-molecular weight polymer is urethane acrylate, ester acrylate, ether acrylate or epoxy acrylate.

5. The sheet according to claim 4, wherein the monomer component includes a (meth)acrylic acid ester monomer, a monomer having a polar functional group, multifunctional acrylate, a monomer having an alkoxy group, a monomer having an aromatic group, or a monomer having a heterocyclic moiety.

6. The sheet according to claim 1, wherein the thermally-cured resin component comprises an acrylic polymer that is cross-linked by a multifunctional cross-linking agent.

7. The sheet according to claim 1, wherein the uncured resin component comprises at least one selected from the group consisting of an acrylic polymer, a polyimide and a cellulose resin.

8. The sheet according to claim 1, wherein the anti-blocking layer has a thickness of 0.01 μm to 20 μm.

9. The sheet according to claim 1, wherein the anti-blocking layer is positioned on the furthest outer surface of the sheet.

10. The sheet according to claim 1, wherein the substrate comprises a polyolefin, an ethylene-vinyl acetate copolymer, an ethylene-alkyl(meth)acrylate copolymer in which the alkyl chain consists of 1 to 4 carbon atoms, ethylene-α-olefin copolymer, propylene-α-olefin copolymer; a polyester; a polyvinylchloride; or a polyester elastomer.

11. The sheet according to claim 10, wherein the anti-blocking layer is a thermally-cured resin component.

12. The sheet according to claim 10, wherein the substrate has a glass transition temperature of 0° C. to 35° C.

13. The sheet according to claim 10, wherein the substrate comprises ester acrylate, ether acrylate, or epoxy acrylate.

14. A method of processing a wafer, comprising:
    attaching the sheet of claim 1 to one side of a semiconductor wafer; and
    processing the wafer to which the sheet is attached.

15. The method according to claim 14, wherein the wafer processing step is a back-grinding step or a dicing step.

* * * * *